US009564915B1

(12) United States Patent
Minhass et al.

(10) Patent No.: US 9,564,915 B1
(45) Date of Patent: Feb. 7, 2017

(54) APPARATUS FOR DATA CONVERTER WITH INTERNAL TRIGGER CIRCUITRY AND ASSOCIATED METHODS

(71) Applicant: Silicon Laboratories Inc., Austin, TX (US)

(72) Inventors: Wajid Hassan Minhass, Oslo (NO); Oeivind A. G. Loe, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/061,039

(22) Filed: Mar. 4, 2016

(51) Int. Cl.
H03M 1/12 (2006.01)
H03M 1/00 (2006.01)

(52) U.S. Cl.
CPC ............. *H03M 1/12* (2013.01); *H03M 1/002* (2013.01)

(58) Field of Classification Search
CPC ................................ H03M 1/12; H03M 1/002
USPC ................................................................ 341/155
See application file for complete search history.

(56) References Cited

U.S. PATENT DOCUMENTS

| | | | |
|---|---|---|---|
| 5,375,067 A | 12/1994 | Berchin | |
| 5,467,056 A | 11/1995 | Goumaz | |
| 7,042,382 B1 | 5/2006 | Paterno | |
| 7,079,058 B2 * | 7/2006 | Efland | H03M 1/002 341/110 |
| 7,589,656 B2 | 9/2009 | Aspelmayr et al. | |
| 7,817,072 B2 * | 10/2010 | Chen | H03M 1/002 341/120 |
| 7,982,651 B1 * | 7/2011 | Zortea | H03M 1/002 341/118 |
| 8,625,727 B2 | 1/2014 | Kargl et al. | |
| 8,692,702 B2 * | 4/2014 | Nam | H03M 1/002 332/144 |

OTHER PUBLICATIONS

AN2658 Application Note, *Using the analog to digital converter of the STM8S microcontroller*, ST, 2009.
Application Note, *XMC 4000 32-bit Microcontroller Series for Industrial Applications: Versatile Analog to Digital Converter(VADC)*, AP32305, Infineon, 2015 (avaible on the Web at http://www.infineon.com/dgdl/Infineon-VADC-XMC4000-AP32305-AN-v01_01-EN.
pdf?fileId=5546d4624e765da5014ed98b2c043824).

* cited by examiner

*Primary Examiner* — Brian Young
(74) *Attorney, Agent, or Firm* — Law Offices of Maximilian R. Peterson

(57) ABSTRACT

An integrated circuit (IC) includes an analog-to-digital converter (ADC). The ADC includes an ADC core circuit integrated in the IC to receive an analog signal, to convert the analog signal to a digital signal in response to a trigger signal. The ADC core circuit further provide the digital signal as an output of the ADC. The ADC further includes internal trigger circuitry integrated in the ADC to provide the trigger signal to the ADC after a prescribed delay period has expired.

20 Claims, 10 Drawing Sheets

APPARATUS FOR DATA CONVERTER WITH INTERNAL TRIGGER CIRCUITRY AND ASSOCIATED METHODS

TECHNICAL FIELD

The disclosure relates generally to signal conversion circuitry and, more particularly, to apparatus for analog-to-digital converters (ADCs) with internal trigger circuitry, and associated methods.

BACKGROUND

Electronic signal-processing often entails processing both analog and digital signals, sometimes called mixed-signal processing. Some sensors or transducers as well as natural properties or attributes, such as temperature, pressure, and the like, either constitute analog quantities or, in the case of sensors, often produce analog signals. Also, some transducers generate analog signals as their output signals.

Conversely, signal-processing circuits and building blocks increasingly use digital signals and digital techniques for reasons such as repeatability, stability, flexibility, and the like, as person of ordinary skill in the art understand. Typically, to interface the signal-processing circuits with analog circuits, signal conversion circuits are used.

One type of signal conversion circuit constitutes analog-to-digital converters (ADCs). ADCs are typically used to accept an analog signal as an input signal, and to provide a digital signal as an output signals. Thus, ADCs can provide an interface between analog circuits, such as transducers, sensors, or other circuits, and digital processing circuits or digital circuits in general.

The description in this section and any corresponding figure(s) are included as background information materials. The materials in this section should not be considered as an admission that such materials constitute prior art to the present patent application.

SUMMARY

A variety of apparatus and associated methods for signal conversion are contemplated. According to one exemplary embodiment, an integrated circuit (IC) includes an ADC. The ADC includes an ADC core circuit to receive an analog signal, to convert the analog signal to a digital signal in response to a trigger signal. The ADC core circuit further provide the digital signal as an output of the ADC. The ADC further includes internal trigger circuitry integrated in the ADC to provide the trigger signal to the ADC after a prescribed delay period has expired.

According to another exemplary embodiment, an apparatus includes a microcontroller unit (MCU) included in an IC. The MCU includes an ADC. The ADC includes an ADC core circuit integrated in the IC to convert an analog signal to a digital signal in response to a trigger signal. The ADC further includes a delay circuit to generate a delay having a prescribed delay period, and to provide a delay-expiration signal when the delay expires. The ADC further includes internal trigger circuitry integrated in the ADC to provide the trigger signal to the ADC core circuit in response to the delay-expiration signal.

According to another exemplary embodiment, a method of performing signal conversion in an IC includes receiving an analog signal in an ADC integrated in the IC, and generating a trigger signal, using internal trigger circuitry integrated in the ADC, after a prescribed delay period has expired. The method further includes converting, in response to the trigger signal, the analog signal to a digital signal by using the ADC.

BRIEF DESCRIPTION OF THE DRAWINGS

The appended drawings illustrate only exemplary embodiments and therefore should not be considered as limiting the scope of the application or the claims. Persons of ordinary skill in the art appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to signal conversion circuits, such as ADCs. More specifically, the disclosed concepts provide apparatus and methods for ADCs with internal trigger circuits, such as ADCs integrated in ICs that have corresponding trigger circuits also integrated in the IC.

Figure 1:
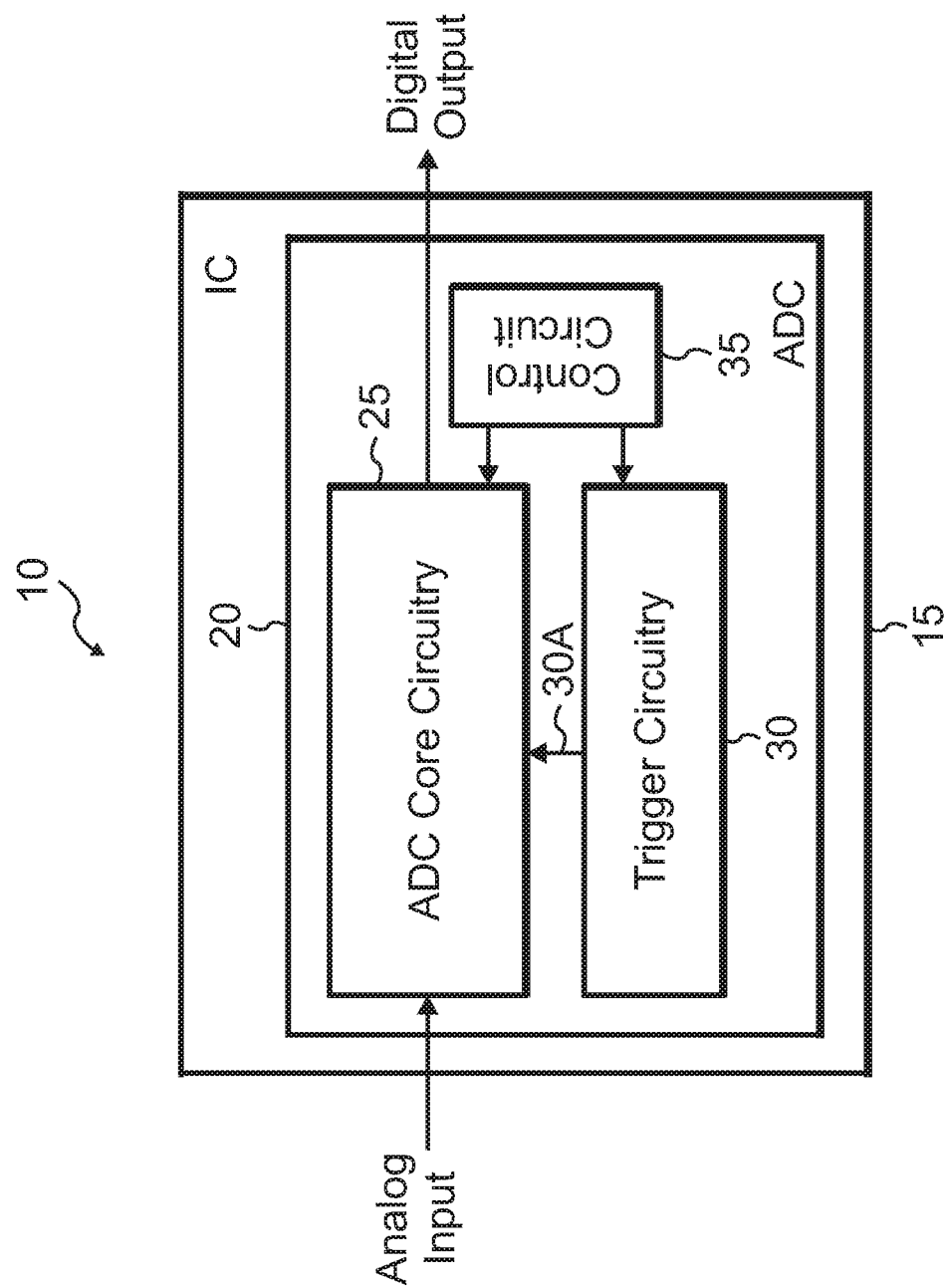
FIG. 1 illustrates a circuit arrangement for analog to digital signal conversion according to an exemplary embodiment.

FIG. 1 illustrates a circuit arrangement 10 for analog to digital signal conversion according to an exemplary embodiment. Circuit arrangement 10 includes an IC 15. IC 15 includes ADC 20. In addition to ADC 20, in exemplary embodiments, IC 20 may include a variety of other circuits (or blocks of circuits, etc.) (not shown), as desired.

Without limitation, such circuits may include analog circuitry, digital circuitry, mixed-signal circuitry, and the like. In some embodiments, ADC 20 may receive one or more analog signals from such analog circuitry and/or mixed-signal circuitry. In some embodiments, ADC 20 may provide one or more digital signals to such digital circuitry and/or mixed-signal circuitry.

Referring to FIG. 1, ADC 20 includes ADC core circuitry (or ADC core circuit) 25. ADC core circuitry includes signal conversion circuitry that performs conversion of an analog input signal (or more than one analog input signal) to a digital output signal of ADC 20. Without limitation, in exemplary embodiments, ADC core circuitry 25 may include successive approximation register (SAR) signal conversion circuitry, flash signal conversion circuitry, delta sigma (ΔΣ) signal conversion circuitry (or, as sometimes known, sigma delta (ΣΔ) signal conversion circuitry), etc., as desired. Generally, any circuit capable of converting one or more analog signals to one or more digital signals may be used in ADC core circuitry 25, as desired.

Referring again to FIG. 1, ADC 20 includes trigger circuitry 30. Trigger circuitry 30 provides trigger signal 30A to ADC core circuitry 25. In response to trigger signal 30A, ADC core circuitry 25 performs signal conversion, i.e., it converts one or more analog input signals to one or more digital output signals, as noted above.

In exemplary embodiments, such as circuit arrangement 10 in FIG. 1, trigger circuitry 30 is integrated in the same IC (e.g., IC 15 in FIG. 1) that includes ADC core circuitry 25. Thus, trigger circuitry 30 is integral or internal to ADC 20 and is integrated in ADC 20.

Trigger circuitry 30 may trigger (via trigger signal 30A) ADC core circuitry 25 in a number of ways. For example, in some embodiments, trigger circuitry 30 automatically triggers ADC core circuitry 25. In some embodiments, trigger circuitry 30 automatically triggers ADC core circuitry 25 after expiration of a prescribed time delay. In some embodiments, trigger circuitry 30 automatically triggers ADC core circuitry 25 so that ADC 20 may alternately perform single channel signal conversion and scan sequence signal conversion.

Control circuit 35 controls the overall operations of ADC 20. For example, control circuit 35 provides one or more control signals to control the operations of ADC core circuitry 25, including turning off (or on) ADC core circuitry 25 (and/or other circuitry in ADC 20), placing ADC core circuitry 25 in a low power mode (i.e., consuming less power than when ADC core circuitry 25 performs signal conversion, a normal or higher power mode), etc. During the low power mode, ADC core circuitry 25 may be configured or controlled such that it consumes less power, for example, by changing transistor body biases (to change the threshold voltages, leakage current, etc.), by inhibiting one or more digital signals in ADC 20 (e.g., a clock signal), etc.

Control circuit 35 also controls the operation of trigger circuitry 30. For example, via control circuit 35, a user of ADC 20 may cause ADC 20 to perform a signal conversion, for instance, by causing trigger circuitry 30 to provide an initial trigger signal to ADC core circuitry 25.

Generally, control circuit 35 includes one or more means of programming or configuring operations of ADC 20. For example, in some embodiments, control circuit 35 includes one or more control (or configuration or programming) registers. The user of ADC 20 programs or configures the contents (e.g., bits) of the control register(s). The contents of the control register(s) control various parameters of the operation of ADC 20, such as which input(s) provide the analog input signal(s), the resolution of the output digital signal, the clock division ratio (by what ration ADC 20 divides a clock provided to it to generate an internal clock signal), mode of operation (e.g., single channel conversion versus scan sequence conversion), low power versus normal operation mode, etc.

In exemplary embodiments, some or all of control circuit 35 may be implemented using hardware or firmware (e.g., non volatile (NV) memory included in IC 15). Some of the functionality of control circuit 35 may be controlled by or implemented in software (e.g., used by a user, for instance, by running software on a host that communicates with IC 15 or ADC 20), etc.

Figure 2:
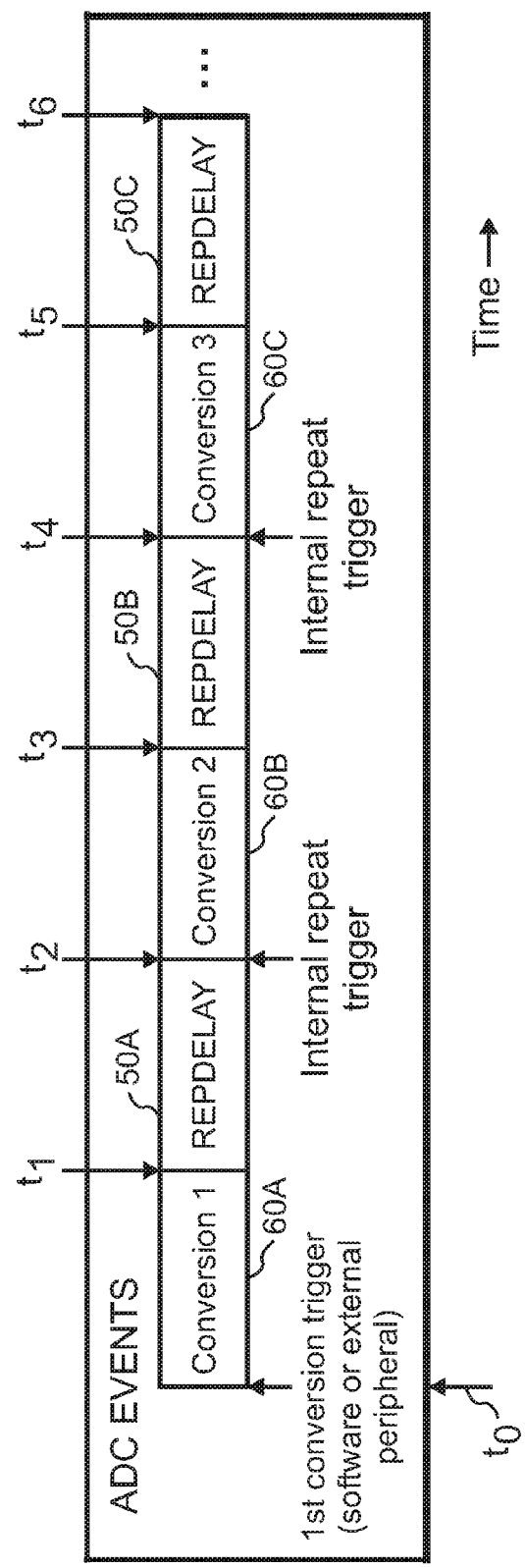
FIG. 2 depicts a diagram of signal conversion events as a function of time according to an exemplary embodiment.

Trigger circuitry 30 provides a number of triggering schemes or configurations for ADC 20. In some embodiments, trigger circuitry 30 triggers ADC core circuitry 25 periodically. FIG. 2 depicts a diagram of ADC events as a function of time showing periodic triggering of the ADC.

Specifically, FIG. 2 shows a number of signal conversions or signal conversion time slots or periods (labeled as "Conversion 1" 60A, "Conversion 2" 60B, "Conversion 3" 60B, etc.) that occur alternately with delay periods (labeled as "REPDELAY" 50A, 50B, 50C, 50D, etc.). At time t0, an initial trigger signal, i.e., a trigger signal for "Conversion 1" 60A is provided to ADC 20 (not shown). The initial trigger signal may be provided under software control, by an external peripheral (external to ADC 20) or other circuit.

In response to the initial trigger signal, ADC 20 performs a signal conversion, identified as "Conversion 1" 60A. At time t1, the signal conversion ends, and delay or delay period 50A (REPDELAY) begins. At time t2, delay period 50A ends or expires. In response, trigger circuitry 30 (not shown) provides a trigger signal to ADC 20.

In response, ADC 20 performs a signal conversion, identified as "Conversion 2" 60B. At time t3, the signal conversion ends, and delay or delay period 50B (REPDELAY) begins by using circuitry in the ADC, for example, a counter. At time t4, delay period 50B ends or expires. In response, trigger circuitry 30 provides a trigger signal to ADC 20.

In response to the trigger signal, ADC 20 performs a signal conversion, identified as "Conversion 3" 60C. At time t5, the signal conversion ends, and delay or delay period 50C (REPDELAY) begins. At time t6, delay period 50C ends or expires. In response, trigger circuitry 30 provides a trigger signal to ADC 20, and so on. The sequence of events, i.e., conversion time slots or periods that occur alternately with delay periods may be repeated as many time as desired (e.g., as many times as programmed or as many as desired conversion cycles, etc.), or indefinitely, as desired.

Note that in some embodiments, delay periods 50A, 50B, 50C, etc. may be equal (i.e., all have the same delay or the same delay length or period), whereas in some other embodiments, delay periods 50A, 50B, 50C, etc. may be unequal (i.e., two or more have delays of different lengths or periods). Note further that in some embodiments, one or more of delay periods 50A, 50B, 50C, etc. may be programmable (e.g., by the ADC user writing appropriate information to the ADC control registers (not shown)).

Furthermore, in some embodiments, during delay periods 50A, 50B, 50C, etc., ADC 20 may be performing other functions. As an example, in some embodiments, during delay periods 50A, 50B, 50C, etc., ADC 20 performs signal conversion on a signal available at another input of ADC 20 (not shown). As a second example, in some embodiments, during delay periods 50A, 50B, 50C, etc., ADC 20 may be turned off or placed in a low power mode to reduce power consumption of ADC 20.

As a third example, during delay periods 50A, 50B, 50C, etc., ADC 20 may be used to calibrate one or more circuits in IC 15. For instance, an analog parameter or value or signal may be applied to an input of ADC 20, a conversion to digital performed, and the resulting digital value compared to a threshold, standard value, desired value, etc. Based on the results of the comparison, one or more parameters, characteristics, values, etc., may be changed. For example, bias level(s) or value(s) or body bias value(s) may be modified or changed.

As a fourth example, ADC 20 may convert to digital parameters that correspond to one or more operating conditions of IC 15, such as voltage (e.g., supply voltage), temperature, and the like. The resulting digital signals or values may be provided to other circuitry in IC 15 and/or be provided to circuitry external to IC 15. In response, circuitry in or external to IC 15 may take various actions, such as change one or more parameters, characteristics, values, etc. For instance, bias level(s), operating or supply voltages, or value(s) or body bias value(s) may be modified or changed. As another example, in the case of a decreasing supply voltage, IC 15 and/or other circuitry may take actions in anticipation of an impending power loss, for instance, save information, generate interrupts, etc., as desired.

Figure 3:
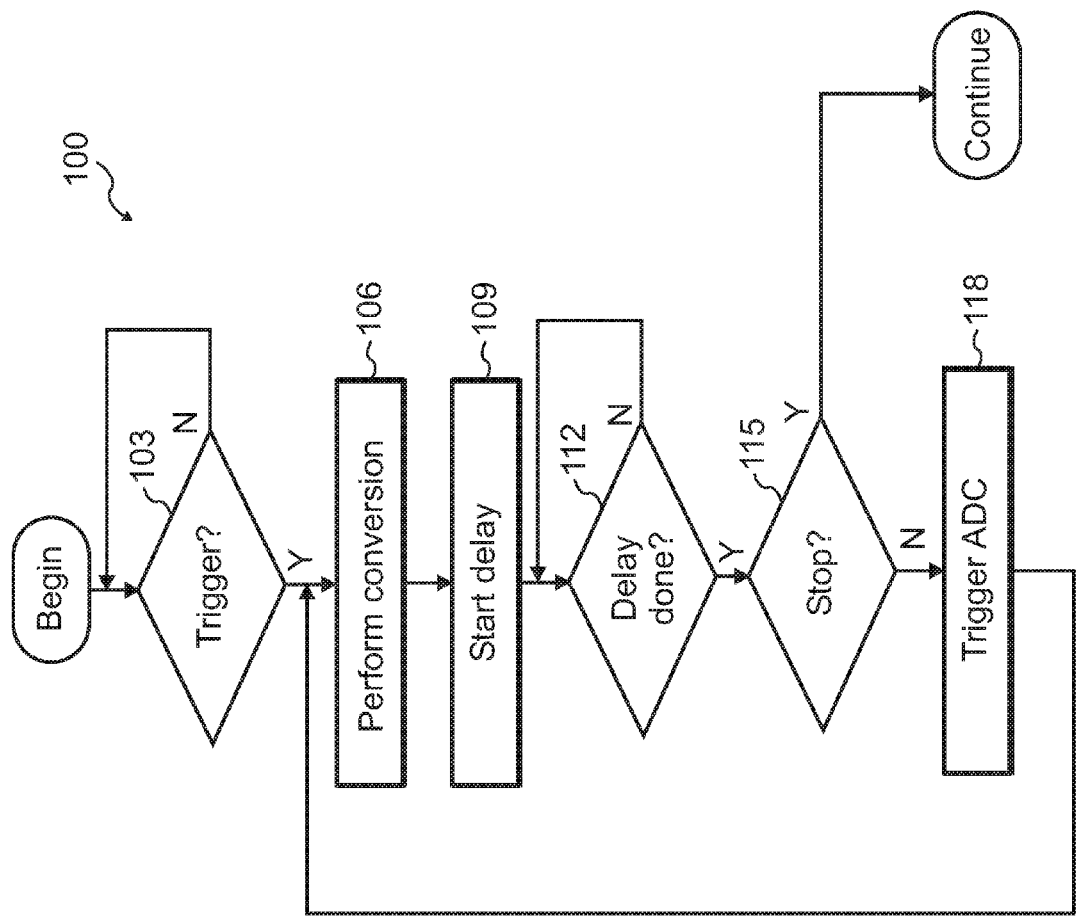
FIG. 3 shows a flow diagram for a method of analog to digital signal conversion according to an exemplary embodiment.

FIG. 3 shows a flow diagram 100 for a method of analog to digital signal conversion according to an exemplary embodiment. Flow diagram 100 generally corresponds to the ADC events shown in FIG. 2.

Referring to FIG. 3, at 103, the process waits for an initial trigger signal. Once an initial trigger signal is received, at 106, a signal conversion is performed. At 109, a delay period is started. At 112, a check is made to determine whether the delay period has ended or expired. If so, at 115, a check is (optionally) made to determine whether signal conversion should stop. If so, processing continues with other operations (if any). If not, at 118, the ADC is triggered. Control then returns to 106, and a signal conversion is performed. Note that in some embodiments, signal conversion may be stopped at various points, for example, in the "no" branch of block 112, or asynchronously, for example, when the user or other source or circuit decides or seeks to stop signal conversion or generally the process shown in FIG. 3.

Note that in some embodiments, delay periods corresponding to 109 may be equal (i.e., all have the same delay or the same delay length or period), whereas in some other embodiments, delay periods corresponding to 109 may be unequal (i.e., two or more have delays of different lengths or periods). Note further that in some embodiments, one or more of delay periods delay periods corresponding to 109 may be programmable (e.g., by the ADC user writing appropriate information to the ADC control registers (not shown)).

Figure 4:
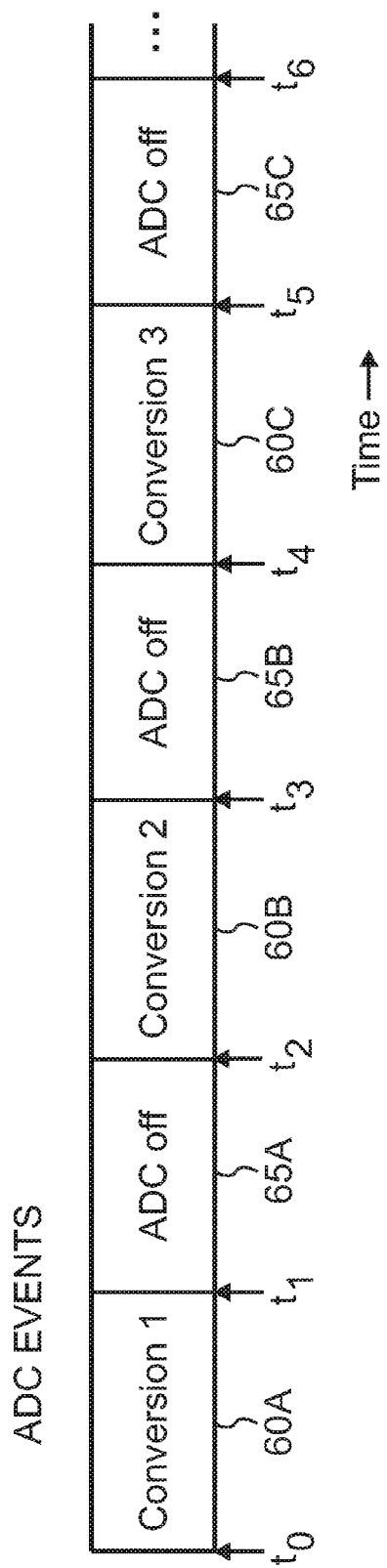
FIG. 4 depicts a diagram of signal conversion events as a function of time according to an exemplary embodiment.

As noted above, trigger circuitry 30 provides a number of triggering schemes or configurations for ADC 20. In some embodiments, trigger circuitry 30 triggers ADC core circuitry 25 periodically to perform signal conversions. Between the signal conversion periods, ADC 20 may be turned off or placed into a low power mode to reduce power consumption of ADC 20 and/or IC 15 (see FIG. 1), while the circuitry or process implementing the delay (e.g., a counter) stays powered. FIG. 4 depicts a diagram of ADC events as a function of time for such a triggering scheme.

Specifically, FIG. 4 shows a number of signal conversions or signal conversion time slots or periods (labeled as "Conversion 1" 60A, "Conversion 2" 60B, "Conversion 3" 60B, etc.) that occur alternately with ADC turn off or low power periods (labeled as 65A, 65B, 65C, etc.). At time t0, an initial trigger signal, i.e., a trigger signal for "Conversion 1" 60A is provided to ADC 20 (not shown). The initial trigger signal may be provided under software control, by an external peripheral (external to ADC 20) or other circuit, as noted above.

In response to the initial trigger signal, ADC 20 performs a signal conversion, identified as "Conversion 1" 60A. At time t1, the signal conversion ends, and ADC 20 is turned off or placed in a low power mode, while the circuitry or process implementing the delay (e.g., a counter) stays powered. At time t2, trigger circuitry 30 (not shown) provides a trigger signal to ADC 20, and ADC 20 is turned on or placed in a normal mode of operation.

In response, ADC 20 performs a signal conversion, identified as "Conversion 2" 60B. At time t3, the signal conversion ends, and ADC 20 is turned off or placed in a low power mode. At time t4, trigger circuitry 30 provides a trigger signal to ADC 20, and ADC 20 is turned on or placed in a normal mode of operation.

In response to the trigger signal, ADC 20 performs a signal conversion, identified as "Conversion 3" 60C. At time t5, the signal conversion ends, and ADC 20 is turned off or placed in a low power mode. At time t6, trigger circuitry 30 provides a trigger signal to ADC 20, ADC 20 is turned on or placed in a normal mode of operation, and so on. The sequence of events, i.e., conversion time slots or periods that occur alternately with periods during which ADC 20 is turned off or placed in low power mode may be repeated as many time as desired (e.g., as many times as programmed or as many as desired conversion cycles, etc.), or indefinitely, as desired.

Note that in some embodiments, the periods during which ADC 20 is turned off or placed in low power mode (65A, 65B, 65C, etc.) may be equal (i.e., all have the same length or period of time). In some embodiments, the periods during which ADC 20 is turned off or placed in low power mode (65A, 65B, 65C, etc.) may be unequal (i.e., two or more have different lengths or periods of time). Note further that in some embodiments, one or more of the periods during which ADC 20 is turned off or placed in low power mode (65A, 65B, 65C, etc.) may be programmable (e.g., by the ADC user writing appropriate information to the ADC control registers (not shown)).

The lengths of the periods during which ADC 20 is turned off or placed in low power mode (65A, 65B, 65C, etc.) may be determined or set or configured or programmed in a number of ways. For example, in some embodiments, such periods are set or controlled or dictated by a delay generator (e.g., timer or counter). As another example, in some embodiments, such periods are set or controlled or dictated by a source external to ADC 200 (e.g., the user of ADC 20, a host, etc.), as desired.

Figure 5:
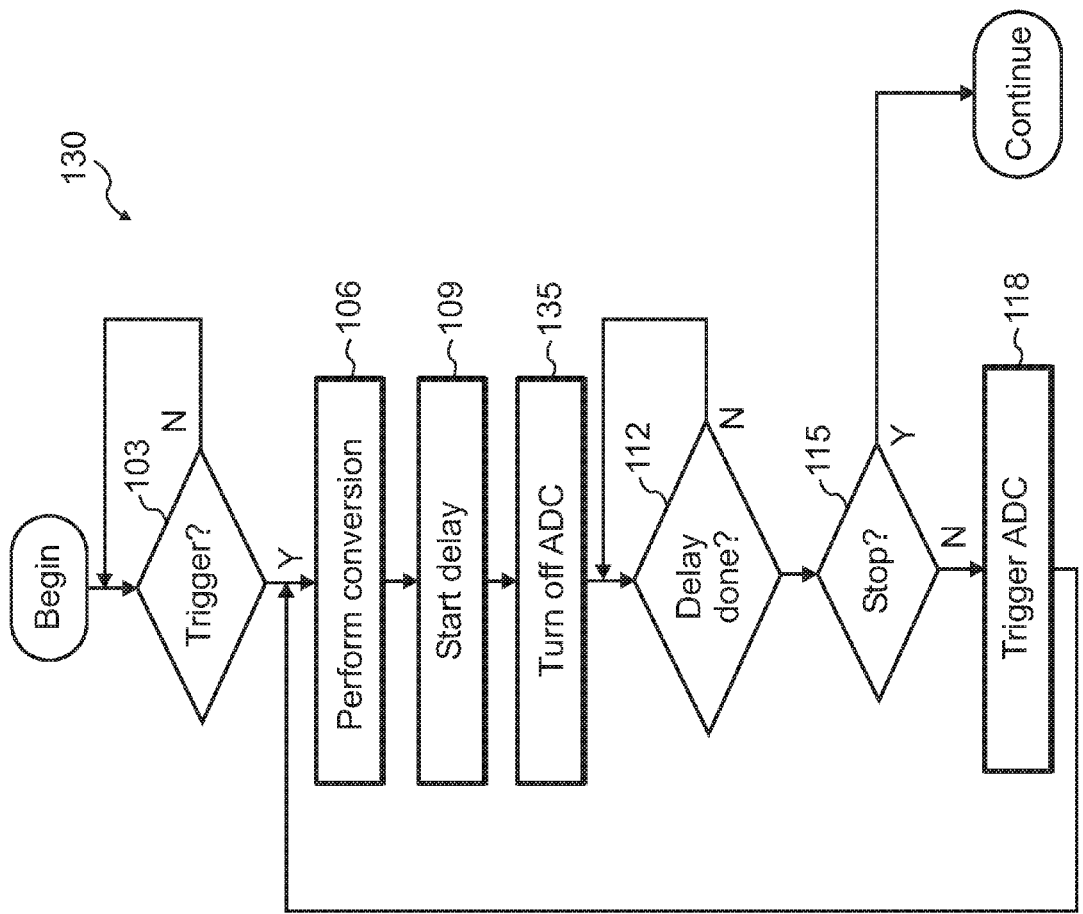
FIG. 5 a flow diagram for a method of analog to digital signal conversion according to an exemplary embodiment.

FIG. 5 shows a flow diagram 130 for a method of analog to digital signal conversion according to an exemplary embodiment. Flow diagram 130 generally corresponds to a scheme where the periods during which ADC 20 is turned off or placed in low power mode are set or controlled or dictated by a delay generator (e.g., timer or counter). Other schemes for determining or setting or controlling the periods during which ADC 20 is turned off or placed in low power mode are contemplated and may be used, as persons of ordinary skill in the art will understand.

Referring to FIG. 5, at 103, the process waits for an initial trigger signal. Once an initial trigger signal is received, at 106, a signal conversion is performed. At 109, a delay period is started. At 135, the ADC is turned off or placed in a low power mode.

At 112, a check is made to determine whether the delay period has ended or expired. If so, at 115, a check is (optionally) made to determine whether signal conversion should stop. If so, processing continues with other operations (if any). If not, at 118, the ADC is triggered. Control then returns to 106, and a signal conversion is performed. Note that in some embodiments, signal conversion may be stopped at various points, for example, in the "no" branch of block 112, or asynchronously, for example, when the user or other source or circuit decides or seeks to stop signal conversion or generally the process shown in FIG. 3.

Note that in some embodiments, delay periods corresponding to 109 may be equal (i.e., all have the same delay or the same delay length or period), whereas in some other embodiments, delay periods corresponding to 109 may be unequal (i.e., two or more have delays of different lengths or periods). Note further that in some embodiments, one or more of delay periods delay periods corresponding to 109 may be programmable (e.g., by the ADC user writing appropriate information to the ADC control registers (not shown)).

Figure 6:
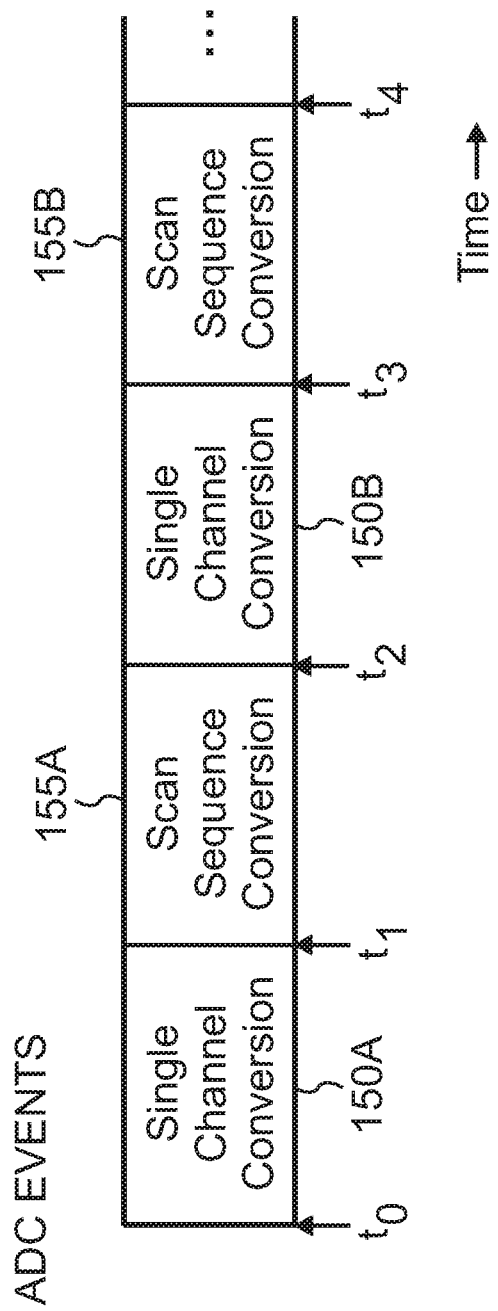
FIG. 6 depicts a diagram of signal conversion events as a function of time according to an exemplary embodiment.
Figure 7:
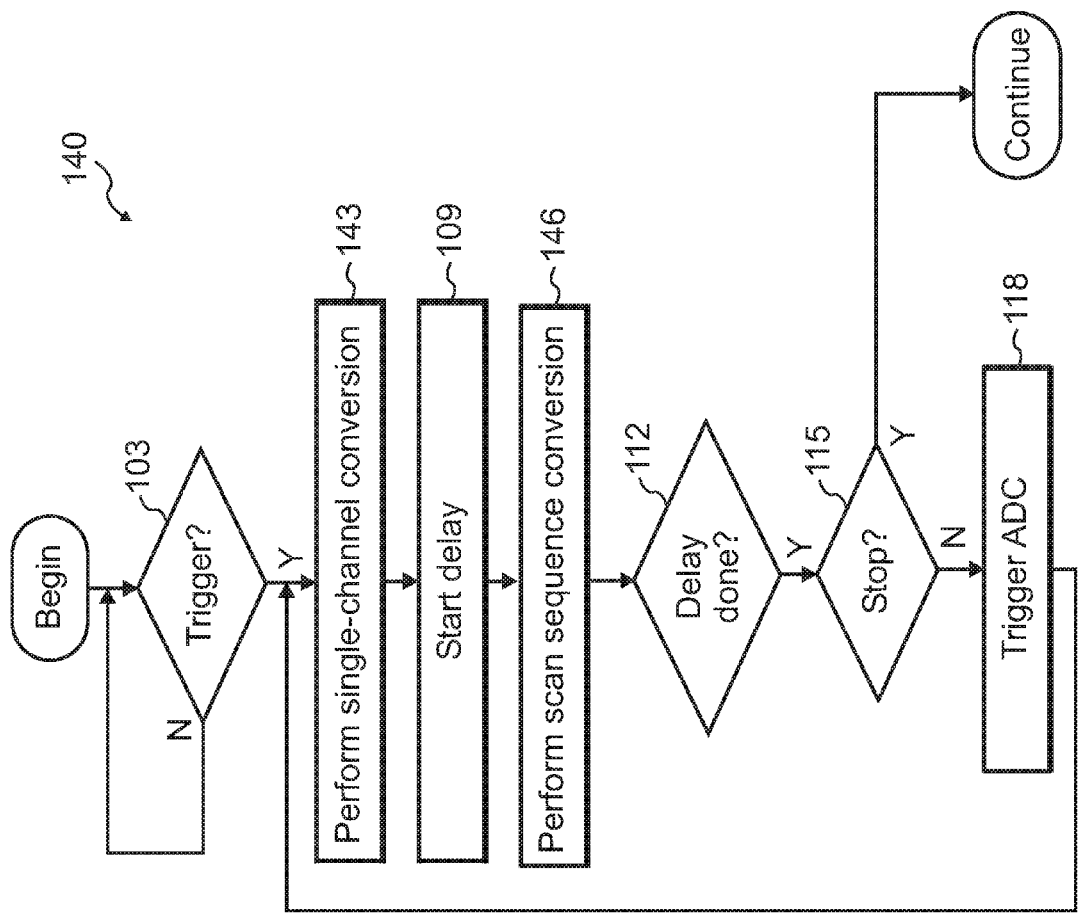
FIG. 7 illustrates a flow diagram for a method of analog to digital signal conversion according to an exemplary embodiment.
Figure 8:
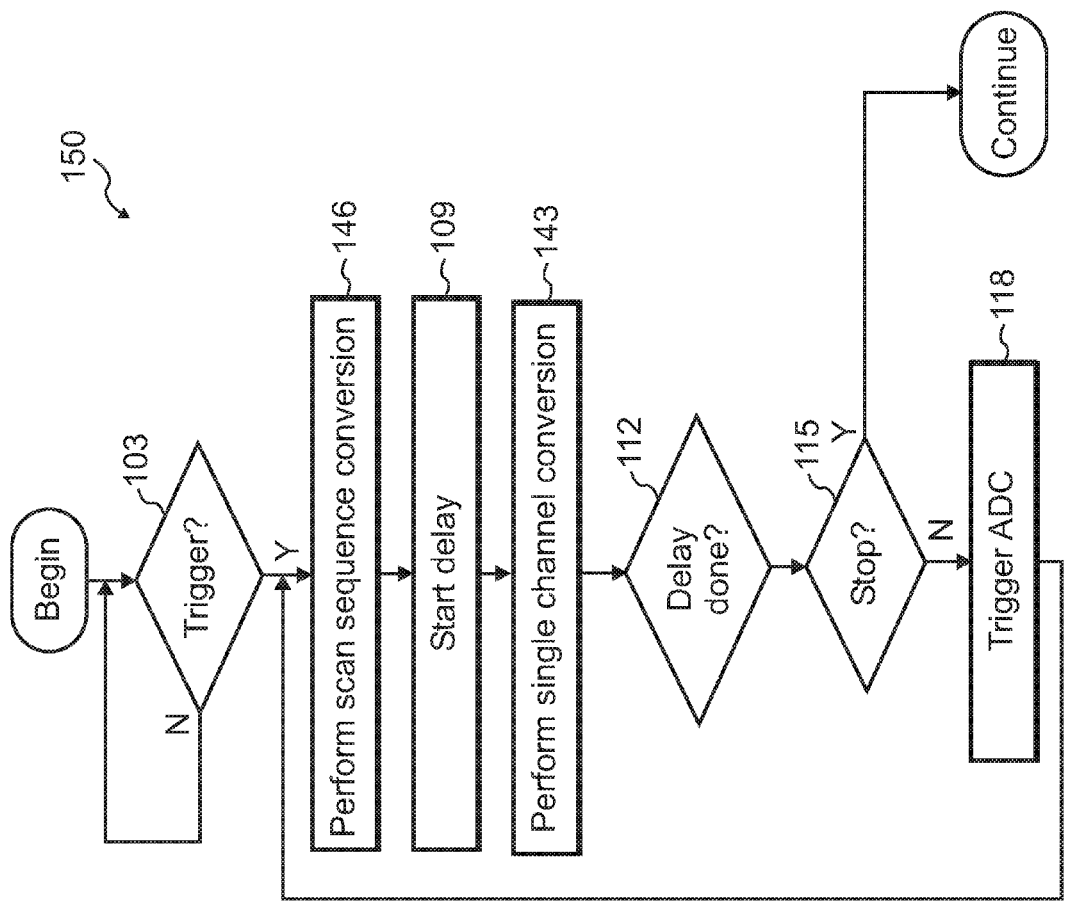
FIG. 8 shows a flow diagram for a method of analog to digital signal conversion according to an exemplary embodiment.

FIGS. 6-8 provide an example of another triggering scheme or configuration for ADC 20. More particularly, the triggering scheme shown in FIGS. 6-8 corresponds to ADC 20 alternately performing one type of signal conversion and another type of signal conversion. The types of signal conversion constitute single channel conversion and scan sequence conversion.

In the single channel conversion mode, ADC 20 (not shown) performs analog to digital conversion of an analog signal provided to one of its inputs. For example, in an exemplary embodiment, ADC 20 may have four inputs or channels, providing four analog signals, any of which may be selected as an input signal to be converted to a digital signal in the single channel mode. For instance, the user may select input 2 (or channel 2) as the input whose corresponding analog signal (received via input 2) is converted to a digital output signal in the single channel conversion mode.

In the scan sequence conversion mode, ADC 20 performs analog to digital conversion of an analog signal provided to its inputs in sequence. For example, in an exemplary embodiment, ADC 20 may have four inputs or channels, receiving four analog signals, respectively. In the scan sequence conversion mode, ADC 20 performs analog to digital conversion of an analog signal provided to channel 1, followed by analog to digital conversion of an analog signal provided to channel 2, followed by analog to digital conversion of an analog signal provided to channel 3 and, finally, followed by analog to digital conversion of an analog signal provided to channel 4. (The sequence may repeat, as desired). Note that single channel conversion and scan sequence conversion are typically separate, independent modes, and use separate initial trigger signals.

In a single channel conversion mode, ADC 20 may perform a single-channel conversion in response to the initial trigger for single-channel conversion. The initial trigger signal may be provided under software control, by an external peripheral (external to ADC 20) or other circuit, as noted above. While the single channel conversion is occurring or the delay is in progress, an initial trigger signal for scan sequence conversion may arrive, in which case ADC 20 will start a scan sequence conversion. When the delay for single channel conversion completes, ADC 20 may optionally suspend the scan sequence conversion, and perform single channel conversion. Alternatively, ADC 20 may complete the scan sequence conversion in progress before performing a single channel conversion. The choice between the two alternatives may be set as part of the configuration of ADC 20, for example, by setting a user configurable control options, as desired. For scan sequence conversion mode, the above description applies, with the roles of the two types of conversion reversed.

A repeat mode is also supported in some embodiments. FIG. 6 depicts a diagram of ADC events as a function of time showing triggering the ADC to repeatedly perform alternate types of signal conversion or operate in alternate modes of signal conversion. Specifically, FIG. 6 shows a number of signal conversions or signal conversion time slots or periods (labeled 150A, 150B, etc.) that occur alternately with number of other signal conversions or signal conversion time slots or periods (labeled 155A, 155B, etc.). Referring to FIG. 6, at time t0, an initial trigger signal, i.e., a trigger signal for single channel conversion 150A is provided to ADC 20. The initial trigger signal may be provided under software control, by an external peripheral (external to ADC 20) or other circuit, as noted above.

In response to the initial trigger signal, ADC 20 performs a signal channel conversion 150A. At time t1, the signal conversion ends, and a delay corresponding to single channel conversion (e.g., REPDELAY) begins. An initial trigger for scan sequence conversion starts conversion 155A, upon the conclusion of which a delay corresponding to scan sequence conversion (e.g., REPDELAY) begins.

At time t2, trigger circuitry 30 provides a trigger signal to ADC 20, in response to which another signal channel conversion 150B begins. At time t3, the signal conversion ends, and another delay period begins, as described above. Trigger circuitry 30 provides a trigger signal to ADC 20, in response to which the scan sequence conversion continues or a new scan sequence conversion (e.g., 155B) begins, and so on.

The process may occur once, or repeat for a number of times, as desired. Thus, the sequence of events, i.e., single channel conversion time slots or periods that occur alternately with scan sequence time slots or periods may be repeated as many time as desired (e.g., as many times as programmed or as many as desired conversion cycles, etc.), or indefinitely, as desired.

The lengths of the signal conversion periods (150A-150B, 155A-155B, etc.) may be determined or set or configured or programmed in a number of ways. Generally, the signal conversion periods depend on controls such as the conversion clock rate of ADC 20 and the resolution in the resulting digital output signal.

Note that in some embodiments, signal conversion periods 150A-150B and/or 155A-155B, etc., may be equal (i.e., all have the same length or period), whereas in some other embodiments, such signal conversion periods may be unequal (i.e., two or more have different lengths or periods). Note further that in some embodiments, one or more of signal conversion periods 150A-150B and/or 155A-155B, etc., may be programmable (e.g., by the ADC user writing appropriate information to the ADC control registers (not shown)).

Note that other schemes for determining or setting or controlling the periods and/or types or modes of conversion of ADC 20 are contemplated and may be used, as persons of ordinary skill in the art will understand. For example, in a variation to the scheme shown in FIG. 6, the order of the time slots or periods for single channel conversion and scan sequence conversions may be reversed. Thus, in such an alternative embodiment, at time t0, the initial trigger signal starts a single channel conversion (rather than a scan sequence conversion). The conversion ends at time t1, and an internal trigger signal from trigger circuitry 30 causes a scan sequence conversion to occur, and so on.

FIG. 7 shows a flow diagram 140 for a method of analog to digital signal conversion according to an exemplary embodiment. Flow diagram 140 generally corresponds to a scheme where ADC 20 alternately performs different signal conversions or alternately operates in different signal conversion modes (e.g., single channel conversion versus scan sequence conversion), for instance, as shown in FIG. 6.

Referring to FIG. 7, at 103, the process waits for an initial trigger signal. Once an initial trigger signal is received, at 143, a single channel conversion is performed. At 109, a delay period is started. At 146, the ADC performs a scan sequence conversion.

At 112, a check is made to determine whether the delay period has ended or expired. If so, at 115, a check is (optionally) made to determine whether signal conversion should stop. If so, processing continues with other operations (if any). If not, at 118, the ADC is triggered. Control then returns to 143, and another signal conversion is performed. Note that in some embodiments, signal conversion may be stopped at various points, for example, in the "no" branch of block 112, or asynchronously, for example, when the user or other source or circuit decides or seeks to stop signal conversion or generally the process shown in FIG. 3.

Note that in some embodiments, delay periods corresponding to 109 may be equal (i.e., all have the same delay or the same delay length or period), whereas in some other embodiments, delay periods corresponding to 109 may be unequal (i.e., two or more have delays of different lengths or periods). Note further that in some embodiments, one or more of delay periods delay periods corresponding to 109 may be programmable (e.g., by the ADC user writing appropriate information to the ADC control registers (not shown)).

As noted above in connection with FIG. 6, the order of the time slots or periods for single channel conversion and scan sequence conversions may be reversed. FIG. 8 shows a flow diagram 150 that corresponds to this situation. Note that the delay values, lengths, or periods corresponding to the delays shown in FIGS. 7 and 8 may be the same or different. Furthermore, such delay values may be programmed, configured, or set, as described above.

Figure 9:
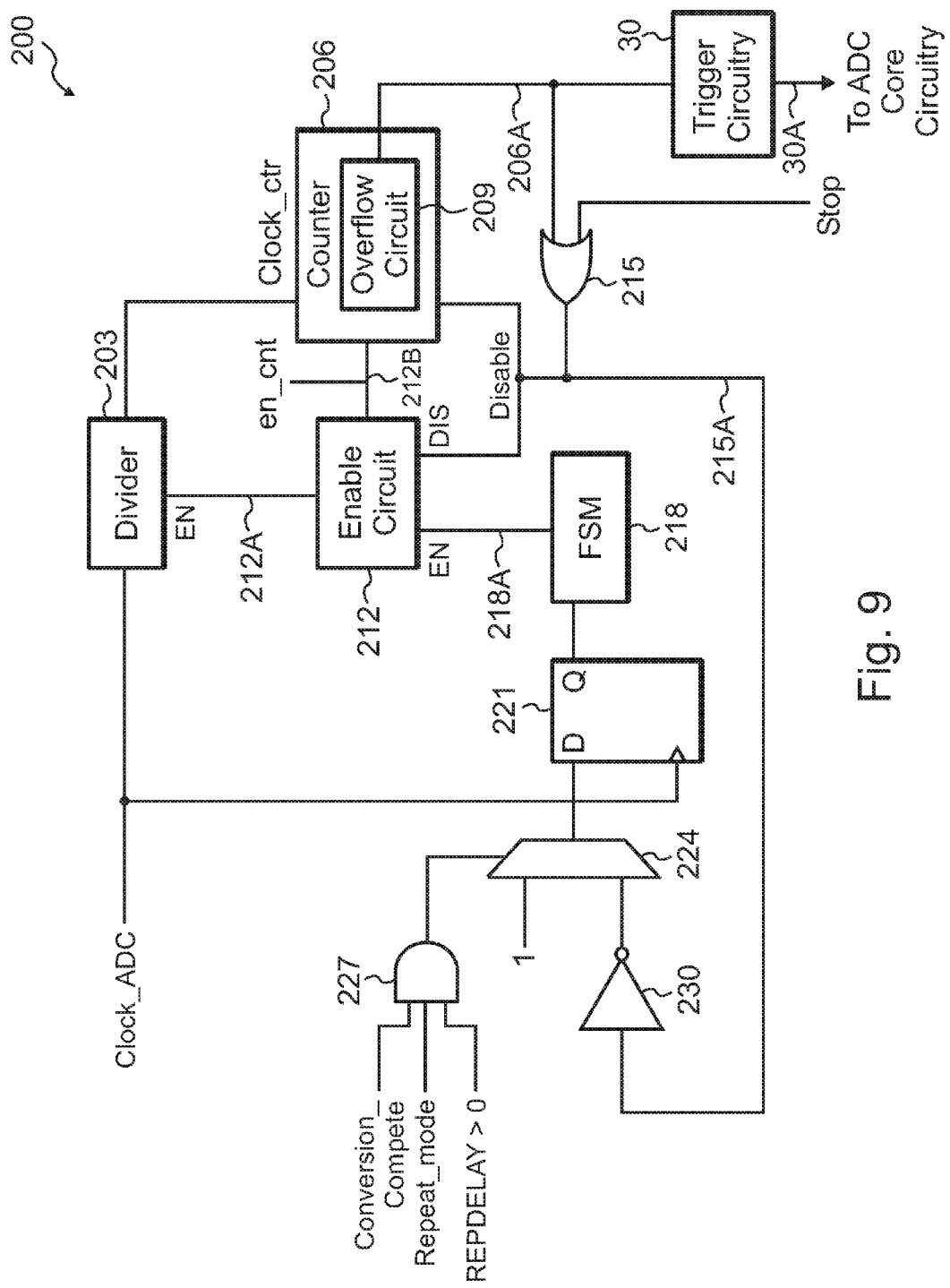
FIG. 9 illustrates a circuit arrangement for facilitating analog to digital signal conversion, using integrated trigger circuitry, according to an exemplary embodiment.

The control of various functions of ADC 20, including the generation of delays, etc., may be performed in a number of ways. FIG. 9 illustrates a circuit arrangement 200 according to an exemplary embodiment for controlling some of the operations of ADC 20. Circuit arrangement 200 shows some of the circuitry in control circuit 35 (see FIG. 1), in addition to trigger circuitry 30.

Referring to FIG. 9, ADC 20 (not shown) operates in response to a clock signal clock_ADC. The clock signal clock_ADC typically has a relatively high value, depending on factors such as the conversion time of ADC 20. Rather than using clock_ADC directly to generate delays, circuit arrangement 200 uses divider 203 to divide the frequency of clock_ADC so as to generate a clock signal, clock_ctr. The clock_ctr is used to clock a counter 206 to generate delay values (e.g., REPDELAY, discussed above, the delay values in FIGS. 2-8, etc.). Because of divider 203 (generating a lower-frequency clock signal clock_ctr), counter 206 may have fewer stages than would be the case if clock_ADC were used to clock counter 206.

The circuit operates as follows: AND gate 227 detects whether all of the following conditions are present: (a) a previous conversion has completed; (b) repeat mode (automatic internal triggering) is enabled, for example, by appropriate programming of the content of the control register(s); and (c) the programmed or set delay length or period, e.g., REPDELAY, is greater than zero.

If so, AND gate 227 causes the signal at the upper input of multiplexer (MUX) 224, i.e., a binary logic one value (logic high signal), to propagate to the output of MUX 224. The output of MUX 224 drives the data input of flip-flop 221, which is clocked by the clock_ADC signal. Thus, on the next clock edge after the data input receives a logic high signal from MUX 224, the output (Q) of flip-flop 221 provides a logic high signal to finite state machine (FSM) 218. In response, FSM 218 starts a delay period (e.g., REPDELAY), as described below in detail.

FSM 218 may be implemented using logic circuits such as flip-flops, gates, registers, etc., as persons of ordinary skill in the art will understand. Rather than FSM 218, other types of logic circuitry may be used in other embodiments, as persons of ordinary skill in the art will understand.

Referring again to FIG. 9, FSM 218 controls the operation of various blocks, such as enable circuit 212 and counter 206. Enable circuit 212 enables the operation of divider 203 and counter 206, as described below. In exemplary embodiments, enable circuit 212 may be implemented using logic circuits, such as gates. In some embodiments, enable circuit 212 is included in the circuitry of FSM 218, as desired. Other implementations are contemplated and possible, as persons of ordinary skill in the art will understand.

Referring again to FIG. 9, in response to the logic high value from flip-flop 221, FSM 218 starts a delay period. More specifically, FSM 218 provides an enable signal 218A to enable circuit 212. In response, enable circuit 212 provides signals 212A and 212B (enable_cnt) to divider 203 and counter 206. Signals 212A and 212B (enable_cnt) enable the operation of divider 203 and counter 206, respectively.

More specifically, in response to signal 212A, divider 203 divides the frequency of signal clock_ADC, as noted above, to generate a pre-scaled clock signal, clock_cnt. The signal clock_cnt clocks counter 206, which causes the counter to count. The counting of pulses of the signal clock_cnt gives rise to delay. After a specified number of clock pulses (e.g., the set, programmed, configured, or prescribed number of pulses corresponding to the desired delay, such as REPDELAY) have been counted or after a counter overflow occurs (as detected by overflow circuit 209), counter 206 provides signal 206A (a logic high value) to trigger circuitry 30. Signal 206A constitute a delay done or delay-expiration signal.

In response to delay-expiration signal 206A, trigger circuitry 30 provides trigger signal 30A to ADC core circuitry 25 (not shown). In response to trigger signal 30A, ADC core circuitry performs a signal conversion. The type of conversion may be any of the types or modes of conversion described above.

In response to signal 206A (high when counting has concluded, i.e., the delay has expired), the output of OR gate 215, i.e., 215A, has a logic high value. The logic high value of output 215A disables enable circuit 212 (and thus divider 203) and counter 206. Disabling divider 203 and counter 206 helps to reduce power consumption of ADC 20.

Referring again to FIG. 9, while signal conversion is in progress in response to trigger signal 30A, the top input to AND 227 has a logic low value (because the conversion has not completed). Consequently, MUX 224 provides the logic value at the output of inverter 230 to the data input of flip-flop 221. Given the logic high value of signal 215A after the delay has expired, the output of inverter 230 has a logic low value, which causes propagation of a logic low value from the output of MUX 224 to the output (Q) of flip-flop 221 in response to clock signal clock_ADC. The logic low value at the output (Q) of flip-flop 221 which prevents FSM 218 from starting a delay period.

Note that a stop signal drives a second input of OR gate 215. Through the stop signal, a source or circuit external to circuit arrangement 200 can stop the operation of various blocks, e.g., stop generation of a delay period. The source for the stop signal may be ultimately the user of ADC 20, another circuit or block in or external to IC 15 (not shown), etc., as desired.

Figure 10:
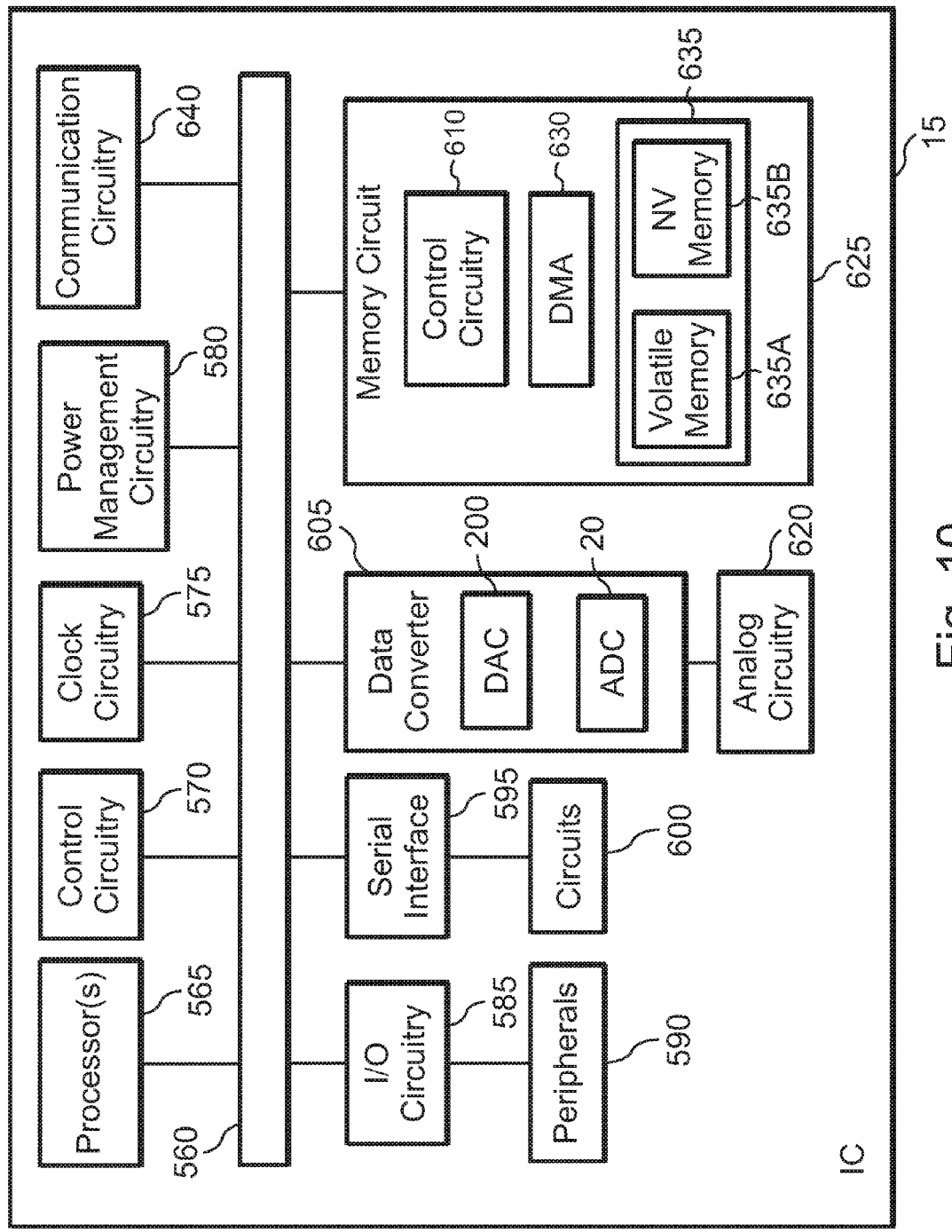
FIG. 10 an IC that combines an ADC with other circuit blocks according to an exemplary embodiment.

ADCs according to exemplary embodiments may be combined with other circuitry, for example, by integrating the ADC and signal processing, logic, arithmetic, and/or computing circuitry within an IC. FIG. 10 illustrates an integrated circuit (IC) 550, for example, a microcontroller unit (MCU), that combines an ADC with other circuit blocks according to an exemplary embodiment.

IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 550 may include link 560 coupled to one or more processors 565, clock circuitry 575, and power management circuitry 580. In some embodiments, processor(s) 565 may include circuitry or blocks for providing computing functions, such as central-processing units (CPUs), arithmetic-logic units (ALUs), and the like. In some embodiments, in addition, or as an alternative, processor(s) 565 may include one or more digital signal processors (DSPs). The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560. In some embodiments, clock circuitry 575 may provide one or more clock signals via link 560 to other blocks in IC 550.

In some embodiments, power management circuitry 580 may reduce an apparatus's (e.g., IC 550) clock speed, turn off the clock, reduce power, turn off power, or any combination of the foregoing with respect to part of a circuit or all components of a circuit. Further, power management circuitry 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I²C, SPI, and the like, as persons of ordinary skill in the art will understand.

Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 550, as described above.

Link 560 may couple to analog circuitry 620 via data converter 605. Data converter 405 may include one or more ADCs 20 and/or one or more DACs 200. The ADC(s) 20 receive analog signal(s) from analog circuitry 620, and convert the analog signal(s) to a digital format, which they communicate to one or more blocks coupled to link 560.

Conversely, DAC(s) 200 receive one or more digital signals from one or more blocks coupled to link 560, and convert the digital signal(s) to an analog format. The analog signal(s) may be provided to circuitry within (e.g., analog circuitry 620) or circuitry external to IC 550, as desired.

Analog circuitry 620 may include a wide variety of circuitry that provides and/or receives analog signals. Examples include sensors, transducers, and the like, as person of ordinary skill in the art will understand. In some embodiments, analog circuitry 620 may communicate with circuitry external to IC 550 to form more complex systems, sub-systems, control blocks, and information processing blocks, as desired.

Control circuitry 570 couples to link 560. Thus, control circuitry 570 may communicate with and/or control the operation of various blocks coupled to link 560. In addition or as an alternative, control circuitry 570 may facilitate communication or cooperation between various blocks coupled to link 560. In some embodiments, the functionality or circuitry of control circuits in ADC 20 (e.g., control circuit 35 described above in connection with FIGS. 1 and 10) may be combined with or included with the functionality or circuitry of control circuitry 570, as desired.

Referring again to FIG. 10, in some embodiments, control circuitry 570 may initiate or respond to a reset operation. The reset operation may cause a reset of one or more blocks coupled to link 560, of IC 550, etc., as person of ordinary skill in the art will understand. For example, control circuitry 570 may cause ADC(s) 20 to reset to an initial state.

In exemplary embodiments, control circuitry 570 may include a variety of types and blocks of circuitry. In some embodiments, control circuitry 570 may include logic circuitry, FSMs, or other circuitry to perform a variety of operations, such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples include universal serial bus (USB), Ethernet, and the like. In exemplary embodiments, other communication protocols may be used, depending on factors such as specifications for a given application, as person of ordinary skill in the art will understand.

As noted, memory circuit 625 couples to link 560. Consequently, memory circuit 625 may communicate with one or more blocks coupled to link 560, such as processor(s) 365, control circuitry 570, I/O circuitry 585, etc. In the embodiment shown, memory circuit 625 includes control circuitry 610, memory array 635, and direct memory access (DMA) 630.

Control circuitry 610 controls or supervises various operations of memory circuit 625. For example, control circuitry 610 may provide a mechanism to perform memory read or write operations via link 360. In exemplary embodiments, control circuitry 610 may support various protocols, such as double data rate (DDR), DDR2, DDR3, and the like, as desired.

In some embodiments, the memory read and/or write operations involve the use of one or more blocks in IC 550, such as processor(s) 565. DMA 630 allows increased performance of memory operations in some situations. More specifically, DMA 630 provides a mechanism for performing memory read and write operations directly between the source or destination of the data and memory circuit 625, rather than through blocks such as processor(s) 565.

Memory array 635 may include a variety of memory circuits or blocks. In the embodiment shown, memory array 635 includes volatile memory 635A and non-volatile (NV) memory 635B. In some embodiments, memory array 635 may include volatile memory 635A. In some embodiments, memory array 635 may include NV memory 635B.

NV memory 635B may be used for storing information related to performance or configuration of one or more blocks in IC 550. For example, NV memory 635B may store configuration information related to control, operation, calibration, or other operation or aspect of ADC(s) 20, as desired or as described above.

As persons of ordinary skill in the art will understand, one may apply the disclosed concepts effectively to various types, arrangements, or configurations of IC. Examples described in this document, such as ICs containing MCU(s), constitute merely illustrative applications, and are not intended to limit the application of the disclosed concepts to other ICs by making appropriate modifications. Those modifications will fall within the knowledge and level of skill of persons of ordinary skill in the art.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An integrated circuit (IC), comprising:
   an analog-to-digital converter (ADC), comprising:
   an ADC core circuit integrated in the IC to receive an analog signal, to convert the analog signal to a digital signal in response to a trigger signal, and to provide the digital signal as an output of the ADC; and
   internal trigger circuitry integrated in the ADC to provide the trigger signal to the ADC after a prescribed delay period has expired.

2. The integrated circuit (IC) according to claim 1, wherein in a first conversion of the analog signal to the digital signal the trigger signal to the ADC core circuit is provided by a source other than the internal trigger circuitry.

3. The integrated circuit (IC) according to claim 1, wherein the ADC core circuit converts the analog signal to the digital signal in a single channel conversion mode.

4. The integrated circuit (IC) according to claim 1, wherein the ADC core circuit converts the analog signal to the digital signal in a scan sequence conversion mode.

5. The integrated circuit (IC) according to claim 1, wherein the ADC core circuit converts the analog signal to a first digital signal in response to a first trigger signal from the internal trigger circuitry.

6. The integrated circuit (IC) according to claim 5, wherein after the delay period has expired, the ADC core circuit converts the analog signal to a second digital signal in response to a second trigger signal from the internal trigger circuitry.

7. The integrated circuit (IC) according to claim 1, wherein the internal trigger circuitry repeatedly provides the trigger signal to the ADC core circuit after successive expirations of the corresponding prescribed delay period, and wherein the ADC core circuit repeatedly converts the analog signal to the digital signal in response to the corresponding trigger signal received after each expiration of the prescribed delay period.

8. The integrated circuit (IC) according to claim 1, wherein the ADC core circuit is turned off until the prescribed delay period expires.

9. The integrated circuit (IC) according to claim 1, wherein the ADC core circuit is placed in a low power mode until the prescribed delay period expires.

10. A microcontroller unit (MCU) included in an integrated circuit (IC), the MCU comprising:
    an analog-to-digital converter (ADC), comprising:
    an ADC core circuit integrated in the IC to convert an analog signal to a digital signal in response to a trigger signal;
    a delay circuit to generate a delay having a prescribed delay period, and to provide a delay-expiration signal when the delay period expires; and
    internal trigger circuitry integrated in the ADC to provide the trigger signal to the ADC core circuit in response to the delay-expiration signal.

11. The microcontroller unit (MCU) according to claim 10, wherein the delay circuit comprises a counter that counts pulses of a pre-scaled version of a clock signal of the ADC.

12. The microcontroller unit (MCU) according to claim 11, wherein the delay-expiration signal is provided when the counter reaches a prescribed count value.

13. The microcontroller unit (MCU) according to claim 10, wherein the delay circuit repeatedly generates the delay having a prescribed delay period and provides a corresponding delay-expiration signal when a corresponding delay period expires, wherein the internal trigger circuitry repeatedly provides the trigger signal to the ADC core circuit in response to the corresponding delay-expiration signal, and wherein the ADC core circuit repeatedly converts the analog signal to the digital signal in response to the corresponding trigger signal.

14. The microcontroller unit (MCU) according to claim 10, wherein the prescribed delay period is programmable.

15. A method of performing signal conversion in an integrated circuit (IC), the method comprising:
- receiving an analog signal in an analog-to-digital converter (ADC) integrated in the IC;
- generating a trigger signal, using internal trigger circuitry integrated in the ADC, after a prescribed delay period has expired; and
- converting, in response to the trigger signal, the analog signal to a digital signal by using the ADC.

16. The method according to claim 15, wherein the prescribed delay period is programmable.

17. The method according to claim 15, wherein a first converting of the analog signal to the digital signal occurs in response to an external trigger signal provided by a source external to the ADC.

18. The method according to claim 15, converting, in response to the trigger signal, the analog signal to a digital signal by using the ADC further comprises performing the conversion in a single channel conversion mode.

19. The method according to claim 15, converting, in response to the trigger signal, the analog signal to a digital signal by using the ADC further comprises performing the conversion in a scan sequence conversion mode.

20. The method according to claim 15, further comprising repeatedly generating a trigger signal after a corresponding prescribed delay period has expired, and repeatedly converting, in response to the corresponding trigger signal, the analog signal to the digital signal by using the ADC.

* * * * *